United States Patent
Nicholson et al.

(10) Patent No.: US 6,615,101 B1
(45) Date of Patent: Sep. 2, 2003

(54) METHOD FOR IDENTIFYING THE BEST TOOL IN A SEMICONDUCTOR MANUFACTURING PROCESS

(75) Inventors: Mark Nicholson, Northumberland (GB); Michael Rettelbach, Hsin-chu (TW)

(73) Assignee: ProMos Technologies, Inc., Hsinchu (TW)

( * ) Notice: Subject to any disclaimer, the term of this patent is extended or adjusted under 35 U.S.C. 154(b) by 311 days.

(21) Appl. No.: 09/688,974

(22) Filed: Oct. 17, 2000

(51) Int. Cl.[7] .............................................. G06F 19/00
(52) U.S. Cl. ...................... 700/173; 700/108; 700/109; 438/14
(58) Field of Search ................................ 700/173, 107; 716/19

(56) References Cited

U.S. PATENT DOCUMENTS 6,041,267 A * 3/2000 Dangat et al. .............. 700/107
6,319,733 B1 * 11/2001 Ozaki .......................... 438/14

* cited by examiner

Primary Examiner—Leo Picard
Assistant Examiner—Charles Kasenge
(74) Attorney, Agent, or Firm—Finnegan, Henderson, Farabow, Garrett & Dunner, LLP

(57) ABSTRACT

A computer-implemented method for identifying a best tool from a plurality of tools that perform a same operation in a semiconductor fabrication line that includes the steps of determining a first median yield for each of the plurality of tools within a first time interval, weighting the first median yield based on a total number of wafers processed by each of the plurality of tools within the first time interval, determining a second median yield for the semiconductor fabrication line over the first time interval, obtaining a weighted yield difference for each of the plurality of tools relative to the second median yield, and outputting the weighted yield difference for each of the plurality of tools.

20 Claims, 2 Drawing Sheets

METHOD FOR IDENTIFYING THE BEST TOOL IN A SEMICONDUCTOR MANUFACTURING PROCESS

BACKGROUND OF THE INVENTION

1. Field of the Invention

This invention pertains in general to a computer-implemented method for comparing performances of semiconductor manufacturing tools, and, more particularly, to a computer-implemented method for identifying the best tool in a semiconductor fabrication line.

2. Description of the Related Art

A semiconductor device is manufactured in a fabrication line with a process that comprises a series of steps. The performance of the fabrication line may be measured in terms of yield, measuring the number of acceptable dies manufactured from a wafer. For example, a 90% yield indicates that out of every 100 dies on a wafer processed by the fabrication line, 90 dies meet the specifications required for the manufacture of the processed wafers. The remaining 10 dies are rejected and discarded. Obviously, the cost of fabricated dies increases when some of the processed wafers are discarded. Therefore, it is desirable to have a highest yield possible for a semiconductor fabrication line.

Sometimes a process step in a fabrication line is performed by a plurality of equipment, or tools. Although these tools perform the same function in carrying out the same process step, the performance of the tools may differ because, for example, they may be manufactured by different manufacturers, or different generations of the same tool manufactured by the same manufacturer. The performance of the tools may also differ because of systematic errors, which indicate one or more of the tools require adjustment or repair. Therefore, tool performance is monitored to improve the yield of the fabrication line.

To ascertain the relative performance of these tools, process engineers and yield engineers periodically monitor the yield for each of the tools and rank the tools accordingly. Specifically, the engineers monitor the yield performance of each tool by comparing the yield performance of each tool to the yield performance of the entire semiconductor fabrication line. Particular abnormal events that adversely affect the yield are accounted for and taken into consideration. The engineers also keep track of the total number of wafers processed by the fabrication line and the individual tools. Together with previous performance data, the engineers tan identify the "best" tool and flag any systematic difference of the tools. Once a systematic difference is identified, the engineers will then adjust and repair the tools as required.

However, this process is time consuming and considerable historical data about wafer-in-process ("WIP") numbers are required to compare the performance of the tools. As a result, instead of concentrating on locating and fixing systematic errors of the tools, much of the effort of the engineers is spent compiling and comparing the data.

SUMMARY OF THE INVENTION

Accordingly, the present invention is directed to a computer-implemented method for identifying the best tool in a fabrication line that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the computer-implemented methods particularly pointed out in the written description and claims hereof, as well as the appended drawings.

To achieve these and other advantages, and in accordance with the purpose of the invention as embodied and broadly described, there is provided a computer-implemented method for identifying a best tool from a plurality of tools that perform a same operation in a semiconductor fabrication line that includes the steps of determining a first median yield for each of the plurality of tools within a first time interval, weighting the first median yield based on a total number of wafers processed by each of the plurality of tools within the first time interval, determining a second median yield for the semiconductor fabrication line over the first time interval, obtaining a weighted yield difference for each of the plurality of tools relative to the second median yield, and outputting the weighted yield difference for each of the plurality of tools.

In one aspect of the invention, the computer-implemented method further includes a step of comparing the weighted first median yield for each of the plurality of tools to the second median yield of the semiconductor fabrication line.

In another aspect of the invention, the computer-implemented method further includes the steps of determining a third median yield for each of the plurality of tools within a second time interval, weighting the third median yield based on a total number of wafers processed by each of the plurality of tools within the second time interval, determining a fourth median yield for the semiconductor fabrication line over the second time interval, comparing the weighted third yield for each of the plurality of tools relative to the fourth median yield of the semiconductor fabrication line, and outputting weighted differences between the third and fourth median yields.

In still another aspect of the invention, the step of outputting includes a step of identifying the best tool as a tool as having a largest weighted yield difference.

Also in accordance with the present invention, there is provided a computer-implemented method for identifying a best tool within a plurality of tools that perform a same operation within a semiconductor fabrication line that includes the steps of determining a first median yield for each of the plurality of tools within a first time interval, determining a second median yield for the semiconductor fabrication line over the first time interval, obtaining a yield difference for each of the plurality of tools relative to the second median yield, weighting the yield difference based on a total number of wafers processed by each of the plurality of tools within the first time Further in accordance with the present invention, there is provided a computer-readable medium storing instructions executable by a processor for identifying a best tool from a plurality of tools that perform a same operation in a semiconductor fabrication line. The computer-executable instructions include determining a first median yield for each of the plurality of tools within a first time interval, determining a second median yield for the semiconductor fabrication line over the first time interval, obtaining a yield difference for each of the plurality of tools relative to the second median yields, weighting the yield difference based on a total number of wafers processed by each of the plurality of tools within the first time interval, and outputting the yield difference for each of the plurality of tools.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawing.

DETAILED DESCRIPTION OF THE PREFERRED EMBODIMENTS

In accordance with the present invention, there is provided a computer-implemented method for identifying the best tool from a plurality of tools in a semiconductor fabrication line that perform the same operation in the same process step. The computer-implemented method of the present invention compares and ranks the performance of these tools so that process and yield engineers may review the information and identify any systematic error. The computer-implemented method of the present invention also eliminates the need for a dedicated source to compile and compare voluminous amounts of data so that the engineers can concentrate their effort on identifying possible systematic errors, and making adjustments and repairs of the tools as required.

Figure 1:
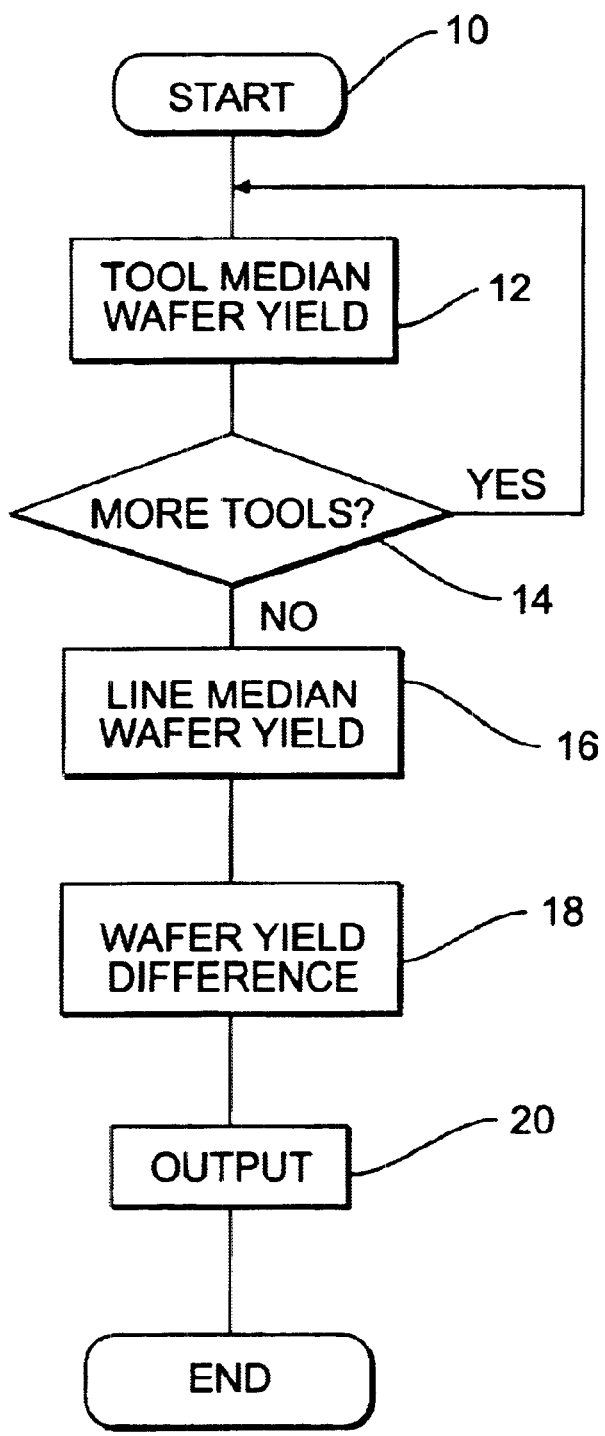
FIG. 1 is a flow chart showing one embodiment of the computer-implemented method of the present invention.

FIG. 1 shows one embodiment of the computer-implemented method of the present invention. Referring to FIG. 1, the method begins at step 10 by identifying a step in the manufacturing process in which more than one tool is used to perform the function required by the step, and the relative performance of the tools is to be compared (step 10). After the step in the manufacturing process is identified, a median yield for the first tool is determined at step 12. The yield for a tool is determined based on the yield of the fabrication line, taking into consideration only those wafers processed by the specific tool, to obtain a weighted median yield. In addition, the weighted median yield is determined over a predetermined time interval, such as over a week or a month. The weighted median yield of the first tool may optionally be stored in an internal memory storage medium of a computer, such as a hard-disk, or an external memory storage medium, such as a computer diskette.

The method of the present invention continues by determining at step 14 whether weighted median yields for all of the tools identified in step 10 have been determined. If there is a tool whose weighted median yield has not been determined, step 12 is repeated to obtain the weighted median yield of the tool over the same predetermined time interval. This process is repeated until the weighted median yield for all of the remaining tools has been obtained. Similarly, these weighted median yields may also be stored.

The method of the present invention continues at step 16 by obtaining the median yield of the fabrication line over the same predetermined time interval as step 12. The median yield of the fabrication line also may be stored. The weighted median yield difference for each of the tools obtained at step 12 relative to the median yield of the fabrication line is obtained at step 18. Specifically, the weighted median yield for each of the tools is subtracted by the median yield of the fabrication line. A positive difference indicates that the tool having a larger median yield than that of the fabrication line outperformed the fabrication line as a whole during the predetermined time interval specified at step 12. A negative difference indicates that the tool has underperformed the fabrication line. As a result, the relative performance of the tools can be ascertained. The differences of the median yields may also be stored in a storage medium.

Step 20 of the method of the present invention continues by outputting the weighted yield difference for each of the tools. As described above, the weighted yield difference is weighted to reflect the total number of wafers processed to account for any data outside the statistical norm, such as a tool having processed one wafer when the other tools processed 30 wafers during the same period. Step 20 may additionally include a step of identifying the best tool among the tools identified in step 10. One criterion for such a determination may be that the tool identified as the best tool has the largest positive wafer difference relative to the median yield of the fabrication line.

Figure 2:
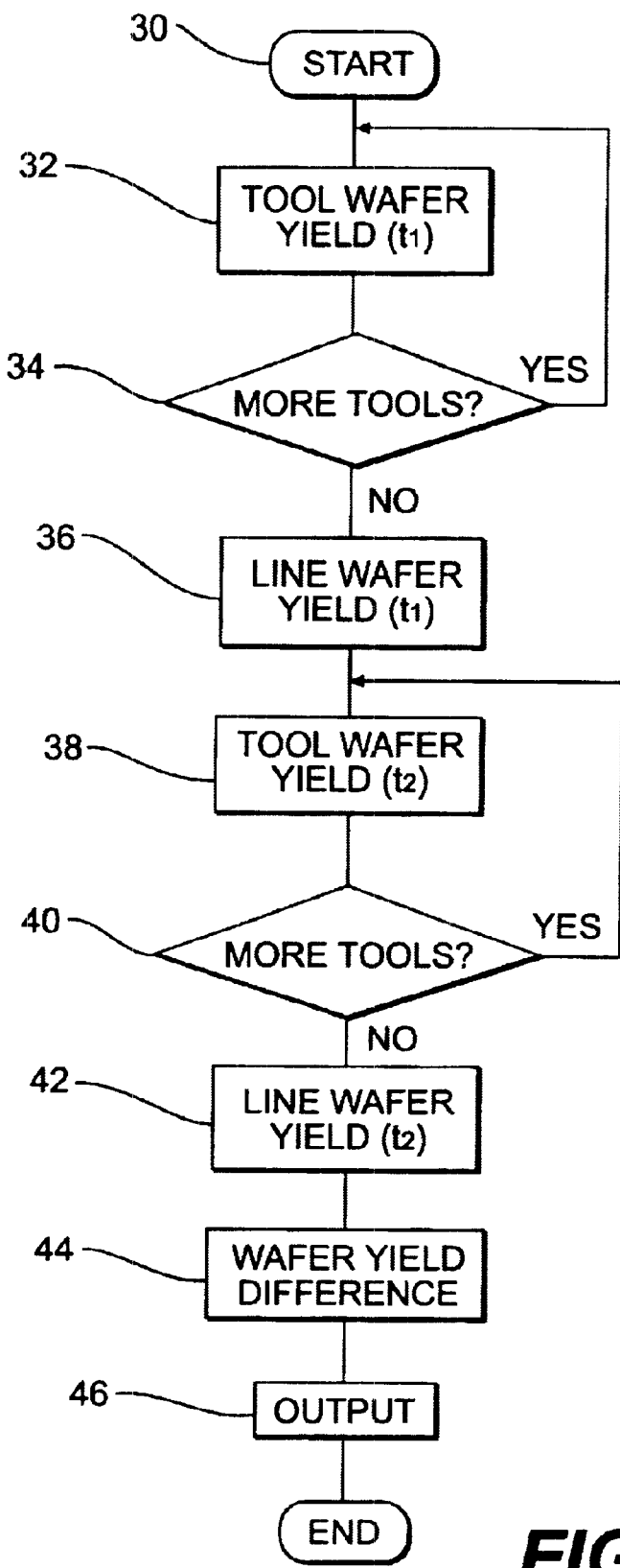
FIG. 2 is a flow chart showing another embodiment of the computer-implemented method of the present invention.

FIG. 2 is a flow chart showing another embodiment of the computer-implemented method of the present invention. Referring to FIG. 2, the method begins 30 by identifying a step in the manufacturing process in which more than one tool is used to perform the function required by the step, and the relative performance of the tools is to be compared. After the step in the manufacturing process is identified, a median yield for the first tool is determined at step 32. The median yield for a tool is determined based on the yield of the fabrication line, taking into consideration only those wafers processed by the specific tool, to obtain a weighted median yield. The weighted median yield is determined over a first predetermined time interval. The weighted median yield of the first tool may optionally be stored in an internal memory storage medium of the computer, such as a hard-disk, or an external memory storage medium, such as a computer diskette.

The method of the present invention continues by determining at step 34 whether the weighted median yields for all of the tools identified in step 30 have been determined. If there is a tool whose weighted median yield has not been determined, step 32 is repeated to obtain the median yield of the tool over the same first predetermined time interval. This process is repeated until the weighted median yield for all of the remaining tools has been obtained. The median yield of the fabrication line over the same first predetermined time interval is obtained at step 36.

The method of the present invention continues at step 38 to obtain weighted median yields for of the tools over a second predetermined time interval. The weighted median yields taken over the second predetermined time interval are taken over the same time duration as the first predetermined time interval, but over a different but consecutive period in time. For example, the first predetermined time interval is taken over a one-week period, and the second predetermined time interval is taken over a one-week period immediately following the first predetermined time interval.

Step 40 determines whether the weighted median yields for all of the tools identified in step 30 have been determined. If there is a tool whose weighted median yield has not been determined, step 38 is repeated to obtain the weighted median yield of the tool over the same second predetermined time interval. This process is repeated until the weighted median yield for all of the remaining tools has been obtained. The median yield of the fabrication line over the same second predetermined time interval is obtained at step 42.

By taking regular samples of the information over a predetermined period of time, the method of the present invention is able to provide a more accurate and sensitive evaluation of the relative performance of the tools as opposed to evaluation the performance over a larger time period, i.e., over a larger time period of the first and second predetermined time intervals combined. It additionally allows for consistent deviations to be observed.

Step 44 determines the weighted yield difference for each of the tools during the first and second predetermined time intervals relative to the median yield of the fabrication line during the first and second predetermined time intervals, respectively. The weighted yield difference for the first and second predetermined time intervals are added also at step 44 to obtain a cumulative weighted yield difference for each of the tools. The weighted yield difference is weighted to reflect the total number of wafers processed to account for any data outside the statistical norm, such as a tool having processed one wafer when the other tools processed 30 wafers during the same period.

Step 46 of the method of the present invention continues by outputting the weighted yield difference for each of the tools during the first and second predetermined time intervals, and the cumulative weighted yield difference for each of the tools over the same period. Step 46 may additionally include a step of identifying the best tool among the tools identified in step 30. One criterion for such a determination may be that the tool identified as the best tool has the largest positive cumulative weighted yield difference. Conversely, step 46 may include a step of identifying the worst tool among the tools identified in step 30, a criterion of which may be a tool having the largest negative cumulative weighted yield difference.

Furthermore, each of the computer-implemented embodiments of the present invention described above may be stored in a computer-readable medium, such as a computer diskette or a CD-ROM, such that it is executable by a processor for identifying a best tool from a plurality of tools that perform a same operation in a semiconductor fabrication line.

An example of present invention, the following table shows the information relating to median yields, and WIPs on a weekly basis over a period of five weeks for five different tools. The compiled information is as follows:

processed by the fabrication line. The symbol Σ represents the cumulative values of the weighted yield differences.

The above table is explained by using Tool 1 as an example. After Week 1, Tool 1 has a weighted yield difference of $-1$. During this period, Tool 1 processed two wafers out of a total of 10 wafers processed by the fabrication line. Taking into consideration the number of wafers processed by Tool 1 during that week in view of the total WIP, the weighted yield difference is for Week 1 is $-1/5$. During the second week, the performance of Tool 1 is the same as that of the fabrication line, and therefore the cumulative weighted yield difference remains at $-1/5$. During the third week, Tool 1 has a yield of $-1$. Again taking into consideration the number of wafers processed by Tool 1 during Week 3, the cumulative wafer difference is $-2/5$ after three weeks. During Week 4, Tool 1 has a yield of $+2$. Taking into consideration the number of wafers processed by Tool 1, the cumulative wafer difference becomes 0. Since the wafer difference for Week 5 is 0, the cumulative wafer difference for Tool 1 over the five-week period is therefore 0.

Accordingly, the above table shows that Tool 3 has the best performance over a five-week period with a cumulative weighted yield difference of $+2$. Accordingly, Tool 3 is designated as the best tool. Conversely, Tool 4 has the worst performance over the same five-week period with a cumulative weighted yield difference of $-3/5$. Thus, Tool 4 is designated as the worst tool.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A computer-implemented method for identifying a best tool from a plurality of tools that perform a same operation in a semiconductor fabrication line, comprising the steps of:

determining a first median yield for each of the plurality of tools within a first time interval;

weighting the first median yield based on a total number of wafers processed by each of the plurality of tools within the first time interval;

determining a second median yield for the semiconductor fabrication line over the first time interval;

|  | Tool 1 | | | Tool 2 | | | Tool 3 | | | Tool 4 | | | Tool 5 | | |
|---|---|---|---|---|---|---|---|---|---|---|---|---|---|---|---|
|  | Δ | WIP | Σ | Δ | WIP | Σ | Δ | WIP | Σ | Δ | WIP | Σ | Δ | WIP | Σ |
| Week 1 | $-1$ | 2/10 | $-1/5$ | 0 | 2/10 | 0 | $+1$ | 4/10 | $+2/5$ | $-5$ | 1/10 | $-1/2$ | 0 | 1/10 | 0 |
| Week 2 | 0 | 2/10 | $-1/5$ | 0 | 2/10 | 0 | $+1$ | 4/10 | $+4/5$ | 5 | 1/10 | 0 | 0 | 1/10 | 0 |
| Week 3 | $-1$ | 2/10 | $-2/5$ | 0 | 2/10 | 0 | $+1$ | 4/10 | $+6/5$ | $-5$ | 1/10 | $-1/2$ | 0 | 1/10 | 0 |
| Week 4 | $+2$ | 2/10 | 0 | 0 | 2/10 | 0 | $+1$ | 4/10 | $+8/5$ | $-1$ | 1/10 | $-3/5$ | 0 | 1/10 | 0 |
| Week 5 | 0 | 2/10 | 0 | 0 | 2/10 | 0 | $+1$ | 4/10 | $+2$ | 0 | 1/10 | $-3/5$ | 0 | 1/10 | 0 |
| Net Result |  | 0 |  |  | 0 |  |  | $+2$ |  |  | $-3/5$ |  |  | 0 |  | wherein the symbol Δ represents the difference in median yield of the tools relative to the median yield of the fabrication line. WIP represents the number of wafers processed by the specific tool relative to the total number of wafers obtaining a weighted yield difference for each of the plurality of tools relative to the second median yield; and outputting the weighted yield difference for each of the plurality of tools.

2. The computer-implemented method as claimed in claim 1, further comprising a step of comparing the weighted first median yield for each of the plurality of tools to the second median yield of the semiconductor fabrication line.

3. The computer-implemented method as claimed in claim 1, further comprising a step of storing the weighted first median yield for each of the plurality of tools.

4. The computer-implemented method as claimed in claim 1, further comprising a step of storing the second median yield for the semiconductor fabrication line.

5. The computer-implemented method as claimed in claim 1, further comprising the steps of determining a third median yield for each of the plurality of tools within a second time interval;

weighting the third median yield based on a total number of wafers processed by each of the plurality of tools within the second time interval;

determining a fourth median yield for the semiconductor fabrication line over the second time interval;

comparing the weighted third median yield for each of the plurality of tools relative to the fourth median yield of the semiconductor fabrication line; and outputting weighted differences between the third and fourth median yields.

6. The computer-implemented method as claimed in claim 5, further comprising a step of storing the weighted third median yield.

7. The computer-implemented method as claimed in claim 5, further comprising storing the fourth median yield.

8. The computer-implemented method as claimed in claim 5, further comprising obtaining a weighted cumulative yield difference for each of the plurality of tool for the first and second time intervals.

9. The method as claimed in claim 8, wherein the step of outputting includes a step of identifying the best tool as a tool as having a largest weighted cumulative yield difference.

10. The method as claimed in claim 8, wherein the first time interval is one week and the second time interval is one week.

11. The method as claimed in claim 1, wherein the step of outputting includes a step of identifying the best tool as a tool as having a largest weighted yield difference.

12. A computer-implemented method for identifying a best tool within a plurality of tools that perform a same operation within a semiconductor fabrication line, comprising the steps of:

determining a first median yield for each of the plurality of tools within a first time interval;

determining a second median yield for the semiconductor fabrication line over the first time interval;

obtaining a yield difference for each of the plurality of tools relative to the second median yield;

weighting the yield difference based on a total number of wafers processed by each of the plurality of tools within the first time interval; and outputting an identification of the best tool.

13. The method as claimed in claim 12, wherein the step of outputting includes identifying the best tool as a tool as having a largest yield difference.

14. A computer-readable medium storing instructions executable by a processor for identifying a best tool from a plurality of tools that perform a same operation in a semiconductor fabrication line, the method comprising determining a first median yield for each of the plurality of tools within a first time interval;

determining a second median yield for the semiconductor fabrication line over the first time interval;

obtaining a yield difference for each of the plurality of tools relative to the second median yields;

weighting the yield difference based on a total number of wafers processed by each of the plurality of tools within the first time interval; and outputting the weighted yield difference for each of the plurality of tools.

15. The computer-readable medium as claimed in claim 14, wherein the step of outputting includes identifying the best tool as a tool as having a largest weighted yield difference.

16. The computer-readable medium as claimed in claim 14, wherein the method further comprises the steps of determining a third median yield for each of the plurality of tools within a second time interval;

determining a fourth median yield for the semiconductor fabrication line over the second time interval;

comparing the third yield for each of the plurality of tools relative to the fourth median yield of the semiconductor fabrication line;

weighting the yield difference based on a total number of wafers processed by each of the plurality of tools within the second time interval; and outputting weighted differences between the third and fourth median yields.

17. The computer-implemented method as claimed in claim 16, further comprising adding the first and third median yield to obtain a weighted cumulative yield difference for each of the plurality of tool.

18. The method as claimed in claim 17, wherein the step of outputting includes a step of identifying the best tool as a tool as having a largest cumulative yield difference.

19. The method as claimed in claim 14, wherein the first time interval is one week.

20. The method as claimed in claim 16, wherein the second time interval is one week.

* * * * *